(12) United States Patent
Goto et al.

(10) Patent No.: US 8,003,919 B2
(45) Date of Patent: Aug. 23, 2011

(54) SUBSTRATE HEAT TREATMENT APPARATUS

(75) Inventors: Shigehiro Goto, Kyoto (JP); Keiji Matsuchika, Kyoto (JP); Akira Yamaguchi, Kyoto (JP); Akihiko Morita, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 604 days.

(21) Appl. No.: 11/566,489

(22) Filed: Dec. 4, 2006

(65) Prior Publication Data

US 2007/0128888 A1 Jun. 7, 2007

(30) Foreign Application Priority Data

Dec. 6, 2005 (JP) .................................. 2005-351939
Dec. 6, 2005 (JP) .................................. 2005-351940

(51) Int. Cl.
*F27B 5/06* (2006.01)
*F27D 5/00* (2006.01)
*H01L 21/30* (2006.01)
*H01L 21/68* (2006.01)
*G03F 7/20* (2006.01)

(52) U.S. Cl. ...... 219/390; 118/728; 432/253; 219/444.1
(58) Field of Classification Search .................. None
See application file for complete search history.

(56) References Cited

U.S. PATENT DOCUMENTS

| | | | | |
|---|---|---|---|---|
| RE31,053 E | * | 10/1982 | Firtion et al. ................ | 355/77 |
| 5,656,093 A | * | 8/1997 | Burkhart et al. ............ | 118/728 |
| 5,738,165 A | * | 4/1998 | Imai ............................ | 165/80.2 |
| 6,129,546 A | * | 10/2000 | Sada ........................... | 432/253 |
| 6,146,504 A | * | 11/2000 | Patadia et al. ............... | 118/728 |
| 6,264,467 B1 | | 7/2001 | Lue et al. | |
| 6,394,797 B1 | | 5/2002 | Sugaya et al. | |
| 6,518,548 B2 | * | 2/2003 | Sugaya et al. ............. | 219/444.1 |
| 6,710,857 B2 | | 3/2004 | Kondo | |
| 7,110,085 B2 | | 9/2006 | Zaal et al. | |

FOREIGN PATENT DOCUMENTS

JP 1-220440 9/1989
JP 2-290013 11/1990

(Continued)

OTHER PUBLICATIONS

Office Action issued Apr. 15, 2010 in related U.S. Appl. No. 11/566,442 of Shigehiro Goto et al., filed Dec. 4, 2006, which includes, at pp. 4-7, a nonstatutory obviousness-type double patenting rejection over certain claims of the present application.

(Continued)

*Primary Examiner* — Joseph M Pelham
(74) *Attorney, Agent, or Firm* — Ostrolenk Faber LLP

(57) ABSTRACT

A heat-treating plate has support elements projecting from an upper surface thereof. The support elements are located at apexes of equilateral triangles arranged regularly and continually. The heat-treating plate and a substrate placed on the support elements form a minute space therebetween which is sealed by a sealer. The substrate is sucked by reducing the pressure in the minute space to a negative pressure through exhaust bores. Since all the distances between adjoining support elements are equal, the substrate sags in the same amount between these support elements. With such arrangement of the support elements, sagging of the substrate is inhibited efficiently by a reduced number of support elements.

11 Claims, 15 Drawing Sheets

FOREIGN PATENT DOCUMENTS

| | | |
|---|---|---|
| JP | 10-284360 | 10/1998 |
| JP | 11329925 A * | 11/1999 |
| JP | 2001-60618 | 3/2001 |
| JP | 2001-332609 | 11/2001 |
| JP | 2003-332411 | 11/2003 |
| JP | 2004-221296 | 8/2004 |
| JP | 2004241702 A * | 8/2004 |
| JP | 2004-343106 | 12/2004 |

OTHER PUBLICATIONS

Japanese Office Action issued Mar. 30, 2010 in connection with Japanese Patent Application No. 2005-351939 (JP10-284360 was previously submitted in an IDS filed Dec. 4, 2006 and is therefore not enclosed.)

Japanese Office Action issued Mar. 30, 2010 in connection with Japanese Patent Application No. 2005-351940.

* cited by examiner

SUBSTRATE HEAT TREATMENT APPARATUS

BACKGROUND OF THE INVENTION (1) Field of the Invention

This invention relates to a substrate heat treatment apparatus for heat-treating substrates such as semiconductor wafers, glass substrates for liquid crystal displays, glass substrates for photomasks and substrates for optical disks (hereinafter simply called "substrates"). More particularly, the invention relates to a technique for heat-treating a substrate as sucked in a position slightly spaced from a heat-treating plate.

(2) Description of the Related Art

With an increasingly fine line width of patterns formed on substrates today, the requirements for line width uniformity have become stringent, which has led to a strong demand for temperature uniformity in baking treatment in photolithography, especially in baking treatment after exposure (PEB: Post Exposure Bake). However, with enlarged substrate sizes, increased curvatures of substrates take place in the semiconductor manufacturing process. It is difficult to satisfy the requirements for temperature uniformity in a proximity heating mode that heats each substrate only by placing the substrate as separated by a minute space from a heat-treating plate.

Thus, a suction bake mode has been proposed in order to perform uniform heat treatment even for curved substrates. This type of apparatus includes a heat-treating plate with a heater, support elements and a sealer arranged on the upper surface of the heat-treating plate, and exhaust bores formed in the upper surface of the heat-treating plate (as disclosed in Japanese Unexamined Patent Publication H10-284360 (1998), for example). With this apparatus, the sealer seals lateral areas of a space formed between a substrate supported by the support elements and the heat-treating plate, and the substrate is sucked by exhausting gas from the space through the exhaust bores. By sucking the substrate, any curvature of the substrate is eliminated whereby the substrate can be heated uniformly.

(I)

The conventional apparatus noted above has the following drawback.

With the conventional apparatus, the substrate under suction sags between each pair of support elements. This aspect will particularly be described with reference to FIG. 1. FIG. 1 is a fragmentary sectional view of a heat-treating plate 51. As seen, a substrate or wafer W is supported by a plurality of support elements 53. A minute space "ms" between the wafer W and heat-treating plate 51 is sealed by a sealer 55. The minute space "ms" is placed under negative pressure by drawing gas therefrom through exhaust bores not shown. At this time, the wafer W sags between each adjacent pair of support elements 53 to be curved toward the heat-treating plate 51 (as shown in solid lines). The difference between maximum and minimum of separation of the wafer W and heat-treating plate 51 is called herein an amount of bending b. In FIG. 1, the dotted line shows the wafer W with the amount of bending at 0 μm.

The amount of bending may be reduced by arranging an increased number of support elements 53 to shorten the intervals therebetween. However, the shorter the intervals are between the support elements 53, the more support elements 53 contact the wafer W. To worsen the situation, the increased contact parts will become sources of particles.

(II)

The conventional apparatus noted above has also the following drawback.

In a photolithographic process, for example, when a sensitizing agent (resist) is applied to a substrate surface, the resist will flow around the end surface to the back surface of the substrate, and adheres to such parts. Consequently, in heating treatment before exposure (i.e. prebake treatment) heating treatment after exposure (PEB: Post Exposure Bake) and heating treatment after development (postbake treatment), when the sealer contacts the edges of the substrate, the resist will be transferred from the substrate to the sealer. This will bring about an inconvenience of causing cross contamination. Such an inconvenience is not limited to the case of sensitizing agent application in the photolithographic process, but can occur also with substrate treatment using other chemicals.

SUMMARY OF THE INVENTION

This invention has been made having regard to the state of the art noted above, and its objects are to provide (I) a substrate heat treatment apparatus capable of efficiently inhibiting sagging of a substrate supported by suction, and (II) a substrate heat treatment apparatus capable of effectively heat-treating a substrate without being influenced by contamination of end surfaces and edge regions of the back surface of the substrate.

The above object (I) is fulfilled, according to this invention, by a substrate heat treatment apparatus for heat-treating a substrate, comprising a heat-treating plate; support devices projecting from an upper surface of the heat-treating plate for contacting and supporting a lower surface of the substrate, the support devices being located at apexes of equilateral triangles arranged regularly and continually on the upper surface; a seal device disposed annularly on the upper surface of the heat-treating plate for contacting edges of the substrate to render gastight a space formed between the substrate and the heat-treating plate; and exhaust bores for exhausting gas from the space.

According to this invention, the support devices are located at the apexes of equilateral triangles arranged regularly and continually. Thus, the distances between adjoining support devices are all equal. With such arrangement of the support devices, sagging of the substrate is inhibited efficiently by a reduced number of support devices. It is conceivable to set the support devices to the corners of squares or hexagons arranged regularly and continually. However, in order to inhibit sagging of the substrate to the same level, this pattern will require more support devices than this invention, and fail to inhibit sagging efficiently.

The term "arranged regularly and continually" means that the equilateral triangles are arranged such that a given equilateral triangle joins another, adjacent equilateral triangle only at one side.

In another aspect of the invention, a substrate heat treatment apparatus for heat-treating a substrate comprises a heat-treating plate; support devices projecting from an upper surface of the heat-treating plate for contacting and supporting a lower surface of the substrate, the support devices being located at intersections of a first group of equidistant, parallel imaginary lines extending across the upper surface of the heat-treating plate, and a second group of imaginary lines rotated 60 degrees from the first group of imaginary lines on the upper surface of the heat-treating plate; a seal device disposed annularly on the upper surface of the heat-treating plate for contacting edges of the substrate to render gastight a space formed between the substrate and the heat-treating plate; and exhaust bores for exhausting gas from the space.

According to this invention, the support devices are located at the intersections of a first group of equidistant, parallel imaginary lines and a second group of imaginary lines rotated 60 degrees from the first group of imaginary lines on the upper surface of the heat-treating plate. Thus, the distances between adjoining support devices are all equal. With such arrangement of the support devices, sagging of the substrate is inhibited efficiently by a reduced number of support devices.

In the above apparatus, one of the support devices may be located at a center point of the heat-treating plate. Then, the remaining support devices can be arranged in positions symmetrical with respect to the center point of the heat-treating plate.

The substrate may be circular and 300 mm in diameter, the space may have an inner pressure reduced to −4 kPa or above and less than 0 Pa by exhaust through the exhaust bores, and the support devices may be arranged at intervals of 35 to 40 mm inclusive. The circular substrate 300 mm in diameter, even when curved, can be sucked appropriately by adjusting the pressure in the space to −4 kPa or above and less than 0 Pa. Further, with the support devices arranged at intervals of 35 to 40 mm inclusive, sagging of the substrate can be inhibited to 0.006 mm or less. As a result, variations in temperature over the plane of the substrate can be suppressed to ±0.03° C. or less.

The object (II) is fulfilled, according to this invention, by a substrate heat treatment apparatus for heat-treating a substrate, comprising a heat-treating plate; a plurality of first support devices arranged regularly on an upper surface of the heat-treating plate for contacting and supporting a lower surface of the substrate; a seal device disposed annularly on the upper surface of the heat-treating plate for contacting positions inward of edges of the substrate to render gastight a space formed between the substrate and the heat-treating plate; and exhaust bores for exhausting gas from the space.

According to this invention, the seal device contacts positions inward of the edges of the substrate. Thus, even when the end surface and edge regions on the back surface of the substrate are contaminated, the seal device will never be contaminated by transfer. The substrate may be heat-treated effectively without causing cross contamination.

The above apparatus may further comprise second support devices for contacting and supporting the lower surface of the substrate, the second support devices being arranged in ranges where the first support devices are relatively sparse, and in positions clear of the first support devices, of a ring-like region of a predetermined width along an inner peripheral surface of the seal device on the upper surface of the heat-treating plate. When the substrate is sucked with the seal device contacting positions inward of the edges of the substrate, an inconvenience can occur in which the edges of the substrate tend to curve up about the seal device serving as the fulcrum. This inconvenience can be eliminated by arranging the second support devices to inhibit sagging of the substrate between the seal device and the first and second support devices adjacent thereto. There occurs no variation in the separation of the substrate and heat-treating plate at the edges of the substrate. Thus, the entire substrate can be heat-treated uniformly.

The expression "the first support devices are relatively sparse, . . . of a ring-like region" refers to parts of the ring-like region where the first support devices are arranged at relatively large circumferential intervals.

In the above apparatus, the first support devices may be located at apexes of equilateral triangles arranged regularly and continually, and the second support devices may be arranged between the seal device and parts, dented toward the center of the heat-treating plate, of an imaginary polygonal line linking those of the first support devices arranged in outermost circumferential positions. This arrangement of the second support devices can effectively suppress curving up of the substrate.

In the above apparatus, the seal device may be shaped annular in plan view; the first support devices may be located at intersections of a first group of equidistant, parallel imaginary lines including an imaginary line passing through a hollow center point of the seal device, and a second group of imaginary lines rotated 60 degrees about the hollow center point from the first group of imaginary lines; and the second support devices may be arranged between the seal device and those of the first support devices arranged in outermost circumferential positions and at a minimum distance to the hollow center point. This arrangement of the second support devices can effectively suppress curving up of the substrate.

In a further aspect of the invention, there is provided a substrate heat treatment apparatus for heat-treating a substrate, comprising a heat-treating plate; a plurality of support devices arranged concentrically on an upper surface of the heat-treating plate for contacting and supporting a lower surface of the substrate; vents for communicating regions inside and outside the support devices; a seal device disposed annularly on the upper surface of the heat-treating plate for contacting positions inward of edges of the substrate to render gastight a space formed between the substrate and the heat-treating plate; and exhaust bores for exhausting gas from the space.

According to this invention, the seal device contacts positions inward of the edges of the substrate. Thus, even when the end surface and edge regions on the back surface of the substrate are contaminated, the seal device will never be contaminated by transfer. The substrate may be heat-treated effectively without causing cross contamination.

In the above apparatus, an interval between the seal device and an outermost one of the support devices may be smaller than intervals between the support devices. When the substrate is sucked with the seal device contacting positions inward of the edges of the substrate, an inconvenience can occur in which the edges of the substrate tend to curve up about the seal device serving as the fulcrum. This inconvenience can be eliminated by providing a relatively small interval between the seal device and the outermost support device to inhibit sagging of the substrate in this interval. There occurs no variation in the separation of the substrate and heat-treating plate at the edges of the substrate. Thus, the entire substrate can be heat-treated uniformly.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

Embodiment 1

Embodiment 1 of this invention will be described hereinafter with reference to the drawings.

Figure 1:
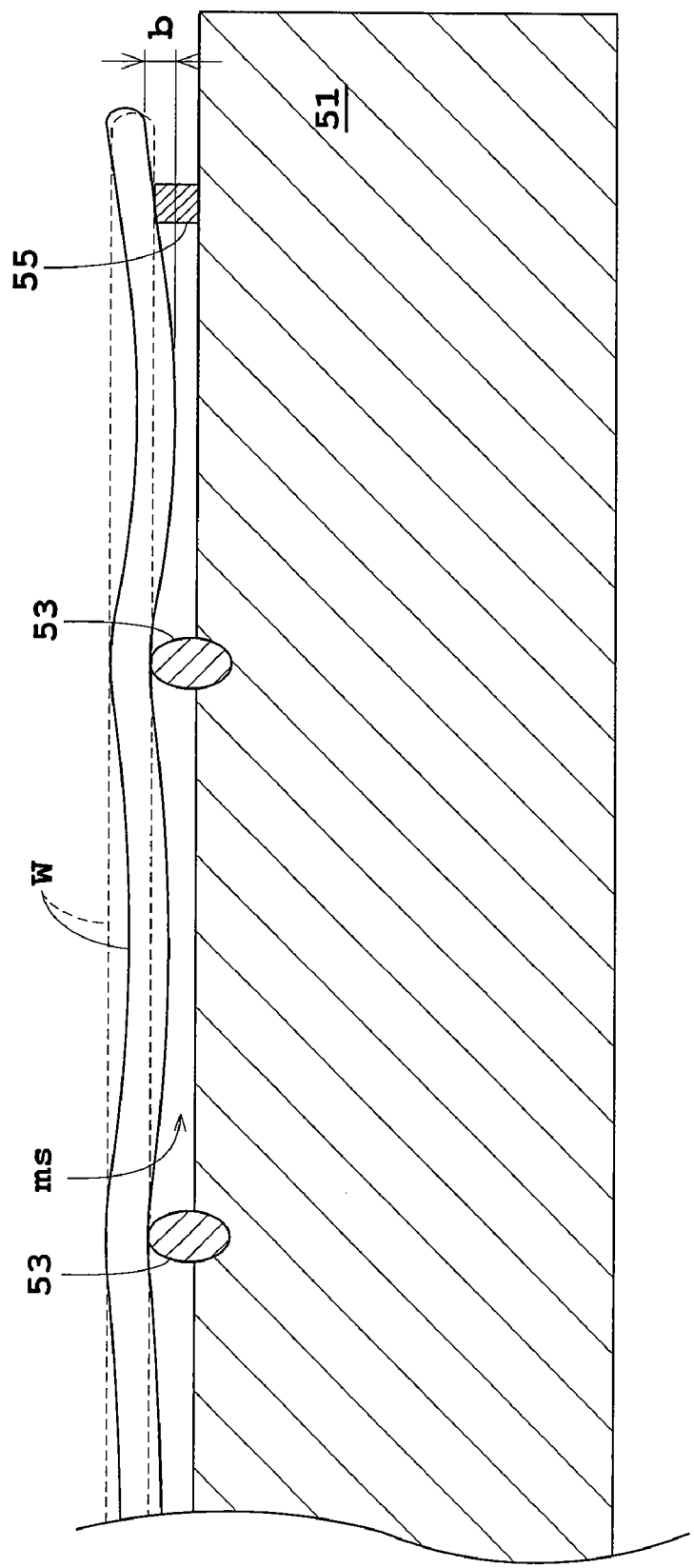
FIG. 1 is an explanatory view showing a substrate sucked in the prior art.
Figure 2:
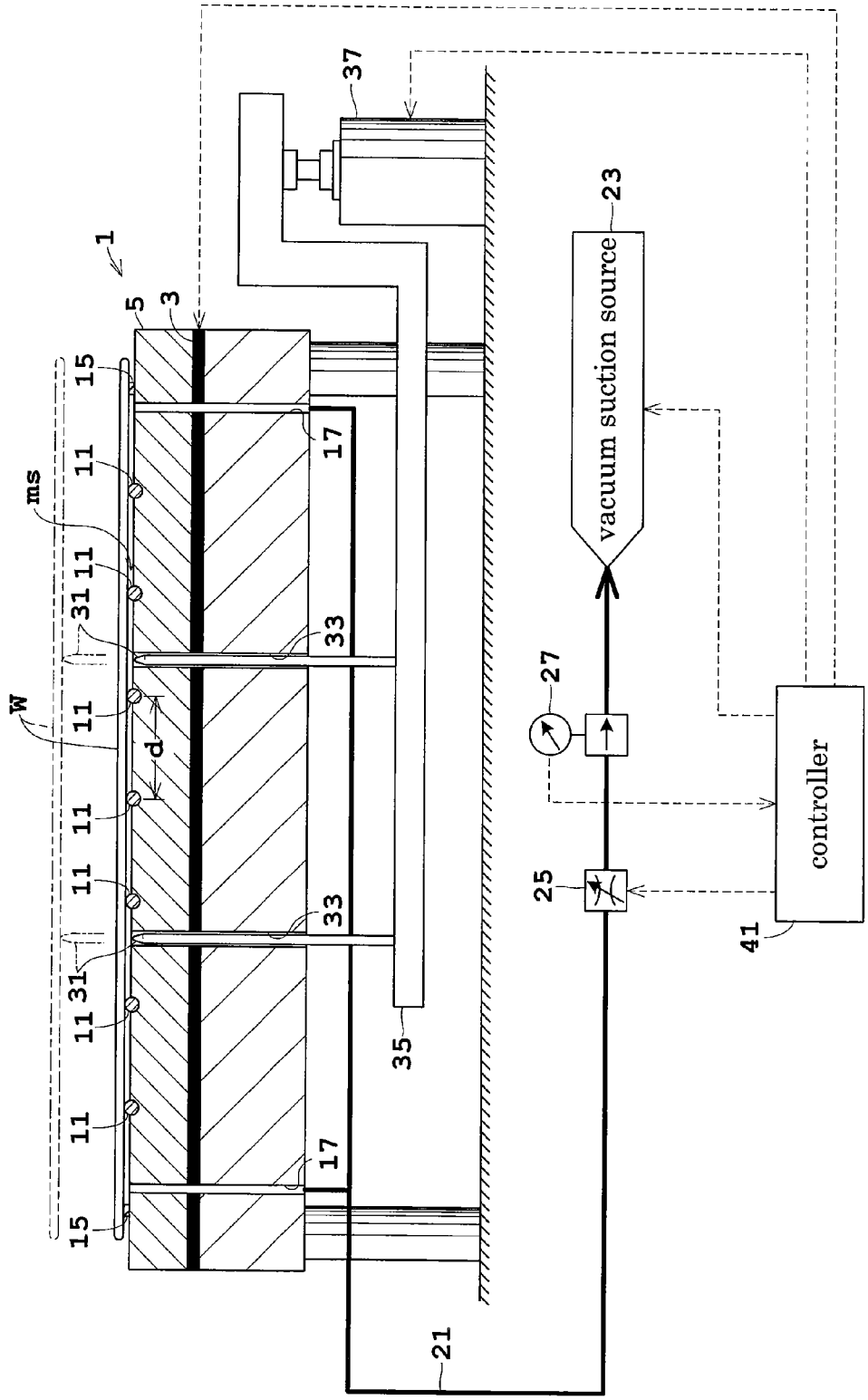
FIG. 2 is a view in vertical section showing an outline of a substrate heat treatment apparatus in Embodiment 1.
Figure 3:
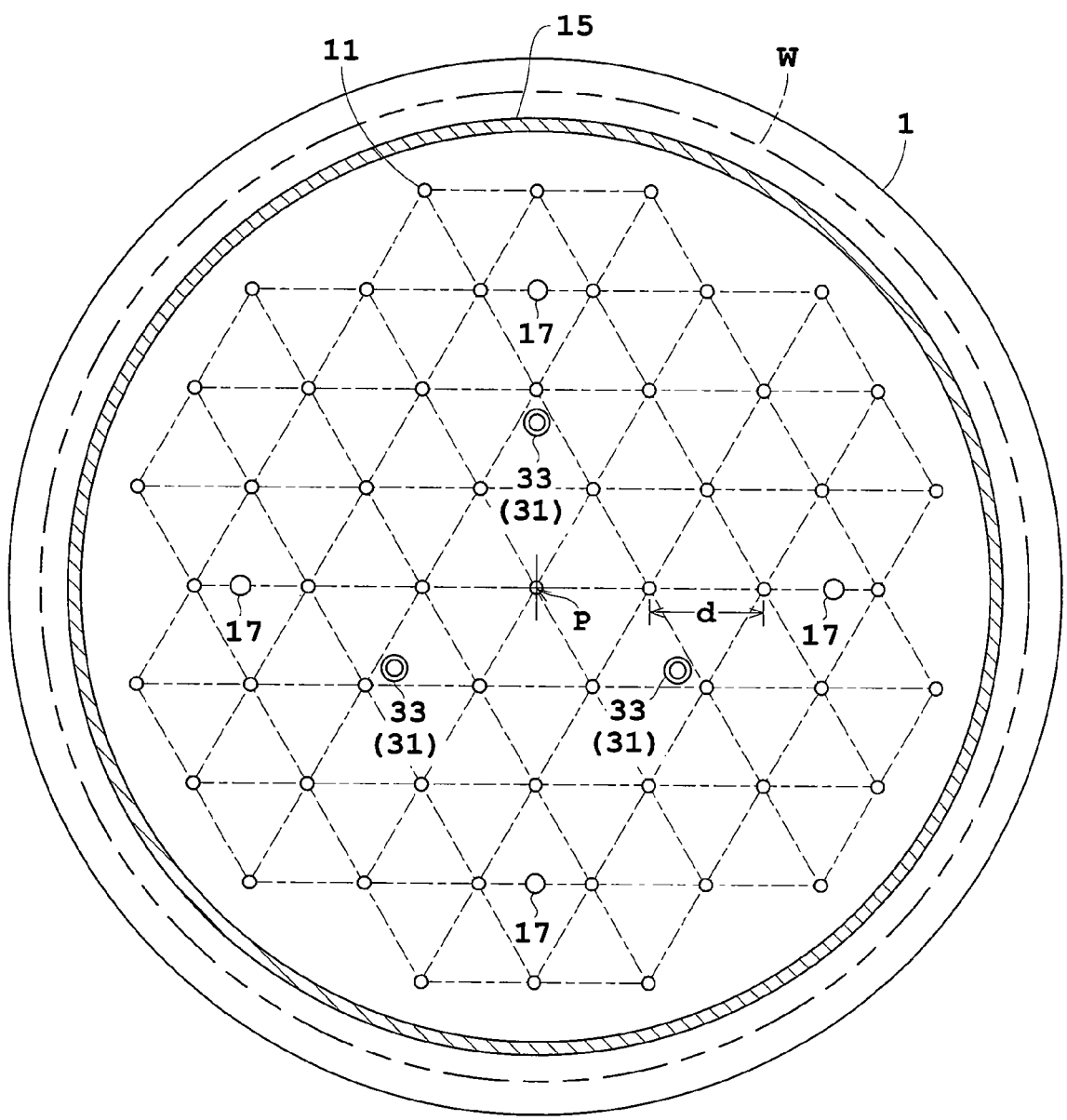
FIG. 3 is a plan view of a heat-treating plate.

FIG. 2 is a view in vertical section showing an outline of a substrate heat treatment apparatus in Embodiment 1. FIG. 3 is a plan view of a heat-treating plate.

A heat-treating plate 1 for supporting a substrate or wafer W under treatment on an upper surface thereof has a heating element 3 such as a mica heater mounted therein. A heat transfer portion 5 between the heating element 3 and the upper surface of heat-treating plate 1 has a plurality of heat pipes, not shown, embedded therein. Cooling grooves, not shown, are formed between the heat pipes for circulating a cooling fluid.

FIG. 3 refers. The heat-treating plate 1 has a plurality of support elements 11 arranged on the upper surface thereof for contacting and supporting the lower surface of the wafer W. These support elements 11 are located at apexes of equilateral triangles assumed to be arranged regularly and continually on the upper surface of heat-treating plate 1 (in FIG. 3, the equilateral triangles are shown in alternate long and short dash lines). Here, the term "regularly and continually" means "in a way to repeat such a pattern that two adjacent equilateral triangles join at two apexes". In other words, the support elements 11 are located at intersections of a first group of equidistant, parallel imaginary lines extending across the upper surface of heat-treating plate 1, and a second group of imaginary lines rotated 60 degrees from the first group of imaginary lines on the upper surface of heat-treating plate 1. The groups of straight lines extending in two given directions among the alternate long and short dash lines shown in FIG. 3 correspond also to the first and second groups of imaginary lines.

In this embodiment, one of the support elements 11 is located at the center point P of the heat-treating plate 1.

The support elements 11 are spherical, and are formed of ceramics, for example. The heat-treating plate 1 has recesses formed in the upper surfaces thereof, in positions where the support elements 11 are arranged. The support elements 11 are fitted in and fixed to the recesses. The support elements 11 correspond to the support devices in this invention.

The heat-treating plate 1 has a ring-shaped sealer 15 mounted on the upper surface thereof and having an inside diameter slightly smaller than the outside diameter of the wafer W in plan view. The sealer 15 has a height equal to the projecting height of the support elements 11. The edge regions of the wafer W in contact with the sealer 15 render gastight a minute space (also called proximity gap) "ms" formed between the heat-treating plate 1 and the wafer W supported by the support elements 11. The sealer 15, preferably, is formed of polyimide resin which has heat resistance and elasticity, for example. Another usable material is fluororesin. The sealer 15 corresponds to the seal device in this invention.

Further, the heat-treating plate 1 has exhaust bores 17 formed in the upper surface thereof for exhausting gas from the minute space "ms". The plurality of (e.g. four) exhaust bores 17 are arranged equidistantly in the circumferential direction. Each exhaust bore 17 extends down to the lower surface of heat-treating plate 1. One end of exhaust piping 21 is connected commonly to these exhaust bores 17, and a vacuum suction source 23 is connected to the other end of the exhaust piping 21. This vacuum suction source 23 is a vacuum utility provided for a cleanroom, for example. The exhaust piping 21 has a pressure regulating valve 25 for regulating pressure (negative pressure) in the minute space "ms", and a pressure gauge 27 for measuring the pressure. The exhaust piping 21 may also have a switch valve with a vacuum breaker. The exhaust piping 21 and vacuum suction source 23 function as an exhaust device.

The heat-treating plate 1 further includes transfer members 31 for transferring the wafer W to and from a transport device not shown. The transfer members 31 are rod-shaped, and are formed of ceramics, for example. In this embodiment, the heat-treating plate 1 has three perforations 33 formed to extend vertically therethrough, in positions corresponding to the apexes of an equilateral triangle centering on the center point P of heat-treating plate 1 and clear of the support elements 11 in plan view. The transfer members 31 are inserted in the perforations 33, respectively. The transfer members 31 have lower ends thereof commonly connected to a single support base 35. The support base 35 is connected to a working rod of an air cylinder 37. The air cylinder 35 is operable to raise and lower the support base 35. These transfer members 31, support base 35 and air cylinder 37 function as a substrate transfer device.

A controller 41 performs an overall control of the apparatus, i.e. controls output of the heating element 3 noted hereinbefore, switching operation of the pressure regulating valve 25, driving of the vacuum suction source 23, and driving of the air cylinder 37. These controls are performed based on a recipe stored beforehand. The switching operation of the pressure regulating valve 25 is based on results of detection by the pressure gauge 27. The controller 41 is realized by a central processing unit (CPU) which performs various processes, a RAM (Random Access Memory) used as the workspace for operation processes, and a storage medium such as a fixed disk for storing a variety of information.

It is desirable that the pressure in the minute space "ms" is adjusted to a negative pressure of −4 kPa or above and less than 0 Pa, for a circular wafer W 300 mm in diameter. More preferably, the pressure in the minute space "ms" is adjusted to −4 kPa. In this embodiment, the controller 41 controls the pressure in the minute space "ms" to be −4 kPa.

When the pressure in the minute space "ms" is a negative pressure of −4 kPa or above and less than 0 Pa, the distance d between adjacent support elements 11 (which corresponds to the "length of one side of the supposed equilateral triangles", and is hereinafter referred to simply as distance d), preferably, is 35 mm to 40 mm inclusive. When the pressure in the minute space "ms" is −4 kPa, the distance d, preferably, is 35 mm. In this embodiment, the support elements 11 are arranged based on the distance d being 35 mm. In this case, the number of support elements 11 is 55.

Figure 4:
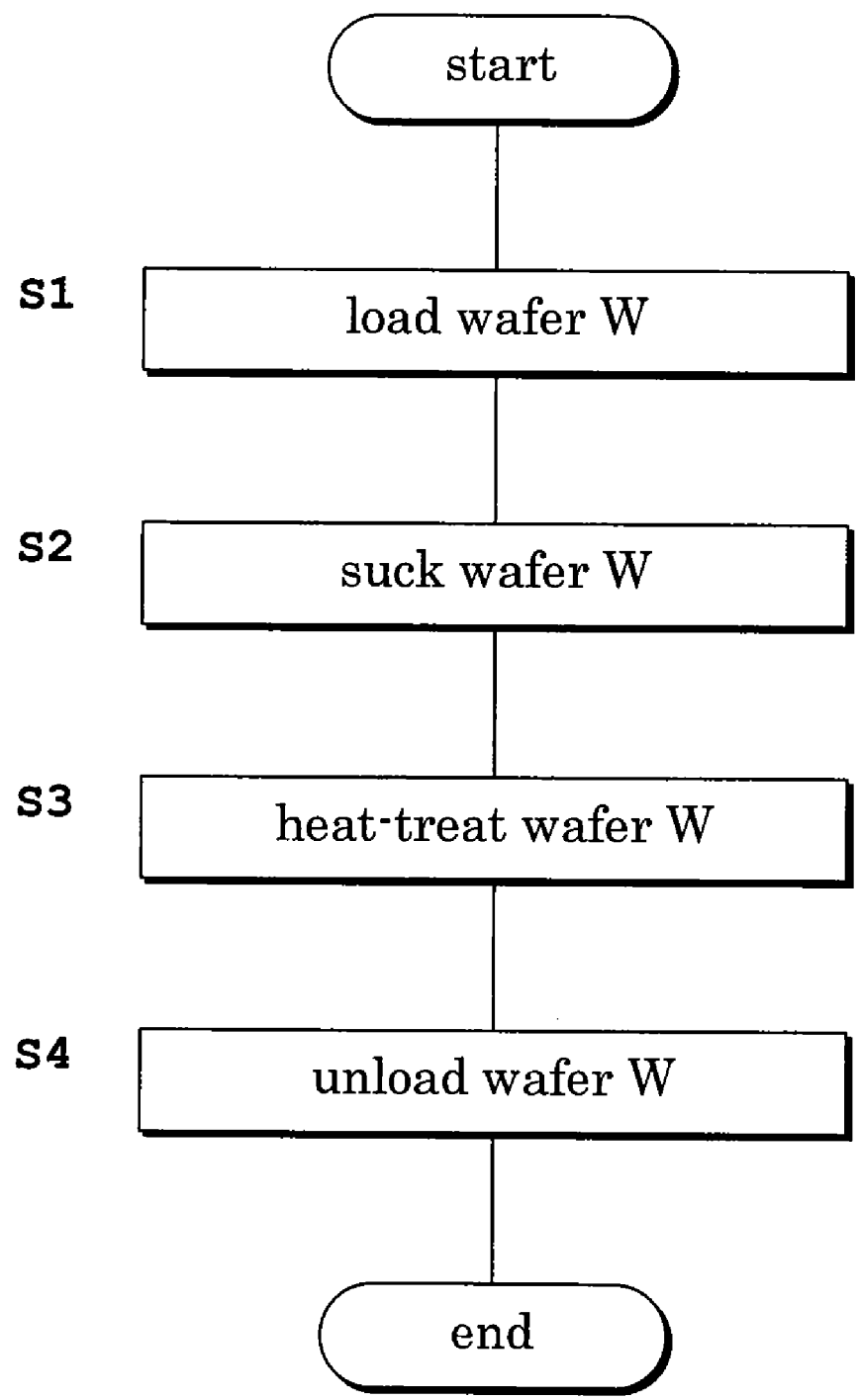
FIG. 4 is a flow chart showing a procedure of treatment by the substrate heat treatment apparatus.

Operation of the substrate heat treatment apparatus having the above construction will be described with reference to FIG. 4. FIG. 4 is a flow chart illustrating a procedure of treatment by the substrate heat treatment apparatus. Temperature control of the heating element 3, for example, is assumed to have already been carried out according to the recipe, and will be omitted from the following description.

<Step S1> Load Wafer W

As the transport device, not shown, loads a wafer W in horizontal posture into the apparatus, the controller 41 drives the air cylinder 37 to raise the support base 35. The transfer members 31 project above the upper surface of heat-treating plate 1, and receive the wafer W. Subsequently, the air cylinder 37 is reversed to lower the transfer members 31. The wafer W is placed on the support elements 11, and the minute space "ms" is formed between the wafer W and heat-treating plate 1. The edge regions of wafer W contact the sealer 15 to render the minute space "ms" gastight.

<Step S2> Suck Wafer W

The controller 41 drives the vacuum suction source 23, and operates the pressure regulating valve 25. As a result, the gas (i.e. air or nitrogen) in the minute space "ms" is exhausted through the exhaust bores 17 and exhaust piping 21. The pressure in the minute space "ms" is adjusted to the predetermined negative pressure (−4 kPa), and the wafer W is sucked toward the heat-treating plate 1. Consequently, a curvature of wafer W, if any, is corrected to follow the support elements 11 and sealer 15.

Figure 5A:
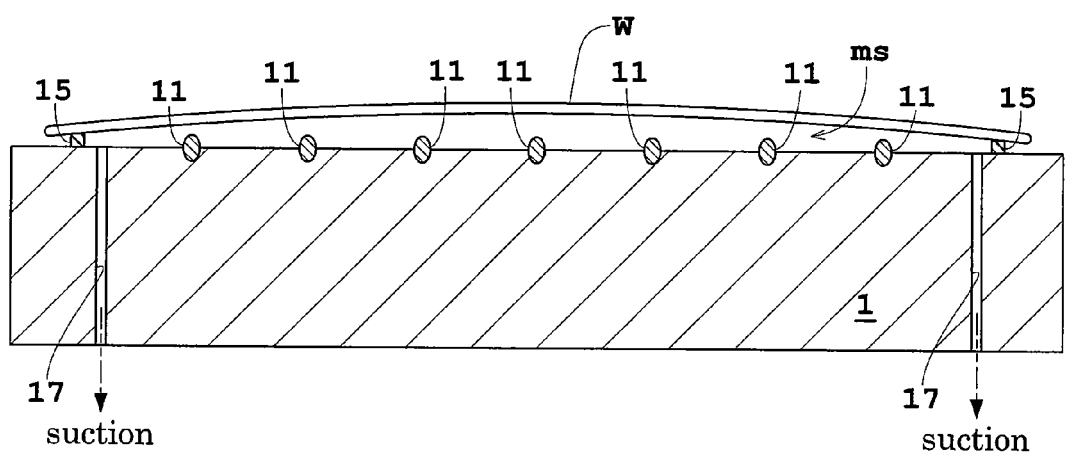
FIG. 5A is an explanatory view showing treatment of a curved substrate with a central portion thereof bulging away from the heat-treating plate.
Figure 5B:
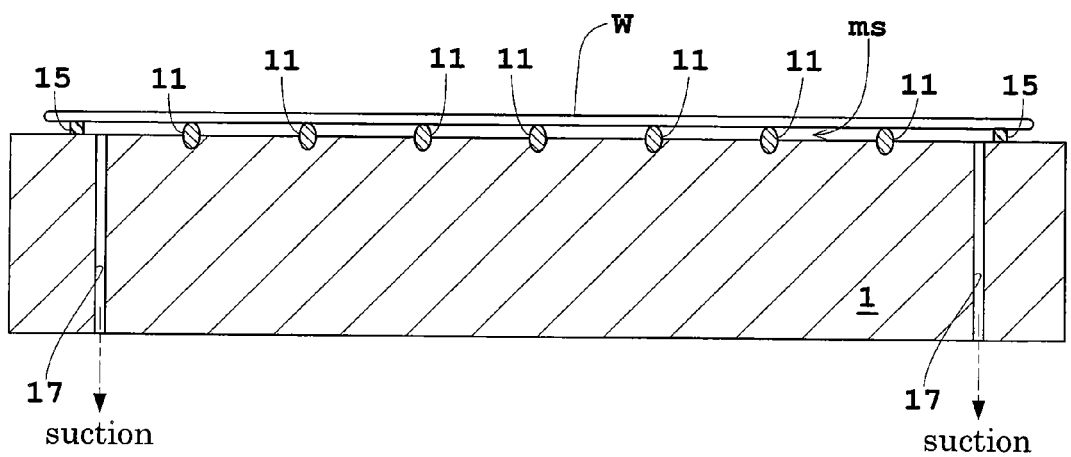
FIG. 5B is an explanatory view showing treatment of the curved substrate with the central portion bulging away from the heat-treating plate.
Figure 6A:
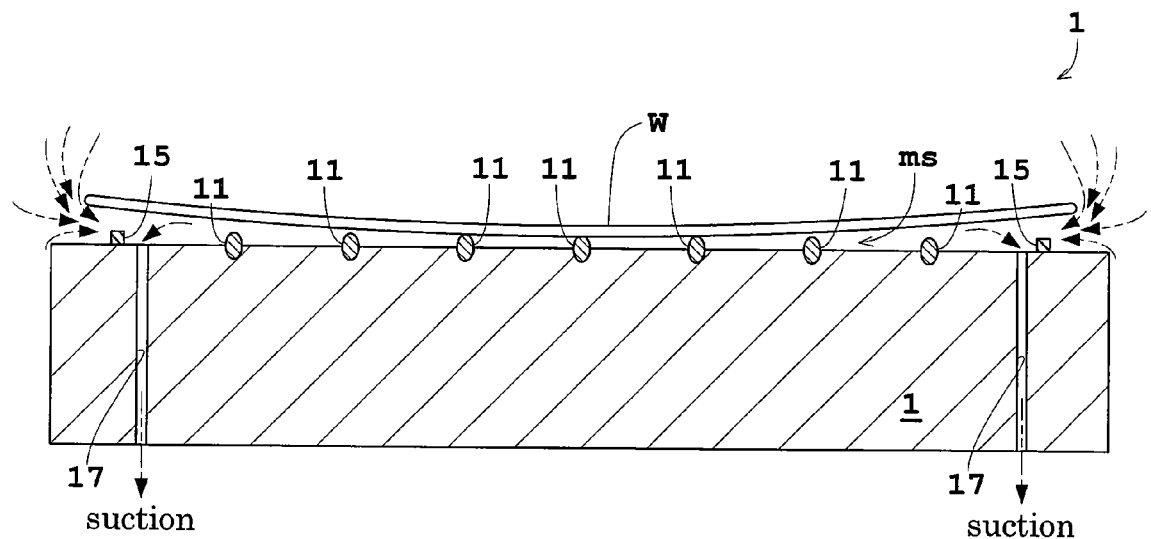
FIG. 6A is an explanatory view showing treatment of a curved substrate with a central portion thereof bulging toward the heat-treating plate.

This process will particularly be described with reference to FIGS. 5A, 5B, 6A and 6B. The curvature of wafer W includes a case where, as shown in FIG. 5A, the wafer W is curved to have the central part bulging upward (dome-like curvature), and a case where, as shown in FIG. 6A, the wafer W is curved to have the central part bulging downward (bowl-like curvature).

Figure 6B:
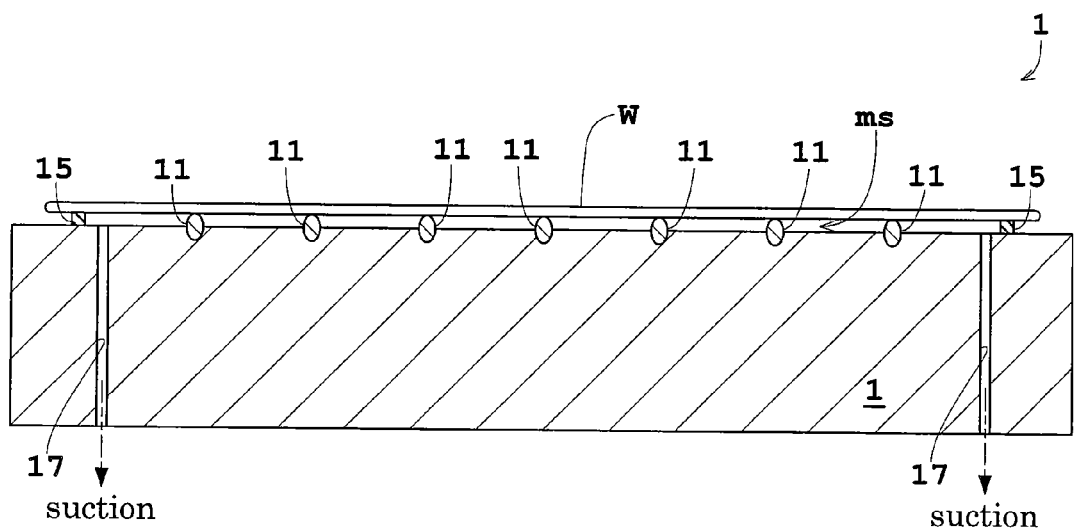
FIG. 6B is an explanatory view showing the treatment of the curved substrate with the central portion bulging toward the heat-treating plate.

When the wafer W with the central part bulging upward is in place, the edge regions of the wafer W is in contact with the sealer 15 to render the minute space "ms" gastight. Thus, the wafer W is drawn toward the heat-treating plate 1 by suction until the central part of wafer W contacts the support elements 11. As a result, the curvature of wafer W is corrected to be substantially level as shown in FIG. 5B. On the other hand, when the wafer W with the central part bulging downward is in place, the wafer W is still out of contact with the sealer 15 so that the minute space "ms" is open sideways. However, the suction applied in this state will cause gas to flow from the ambient through the gap between the wafer W and sealer 15 into the minute space "ms", producing Bernoulli effect to draw the edge regions of wafer W downward (FIG. 6A shows air flows in two-dot chain lines). The sealer 15 will soon contact the edge regions of the wafer W to render the minute space "ms". The curvature of wafer W is corrected to be substantially level as shown in FIG. 6B.

With a circular wafer W 300 mm in diameter, its curvature is said to be 300 μm or less. Even when the wafer W has a bowl-like curvature of 300 μm, the pressure in the minute space "ms" at −4 kPa can suck the wafer W to correct the curvature.

Even if the curvature can be corrected in this way, strictly speaking, the wafer W will sag between the support elements 11 to be curved toward the heat-treating plate 1. However, with the support elements 11 located, respectively, at the apexes of the equilateral triangles arranged regularly and continually, any one support element 11 is surrounded by six other support elements 11 at the distance d therefrom, so that no area exists for allowing any significant sagging of the wafer W. A reduced number of support elements 11 can efficiently inhibit sagging of the wafer W.

Figure 7A:
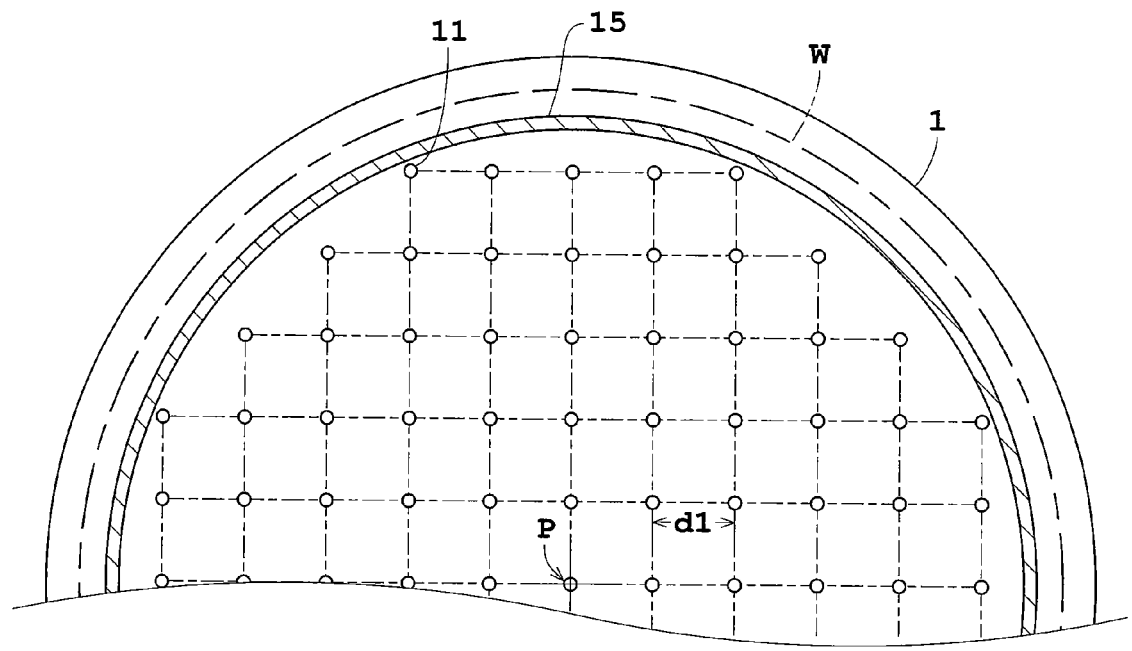
FIG. 7A is an explanatory view of a square arrangement pattern.
Figure 7B:
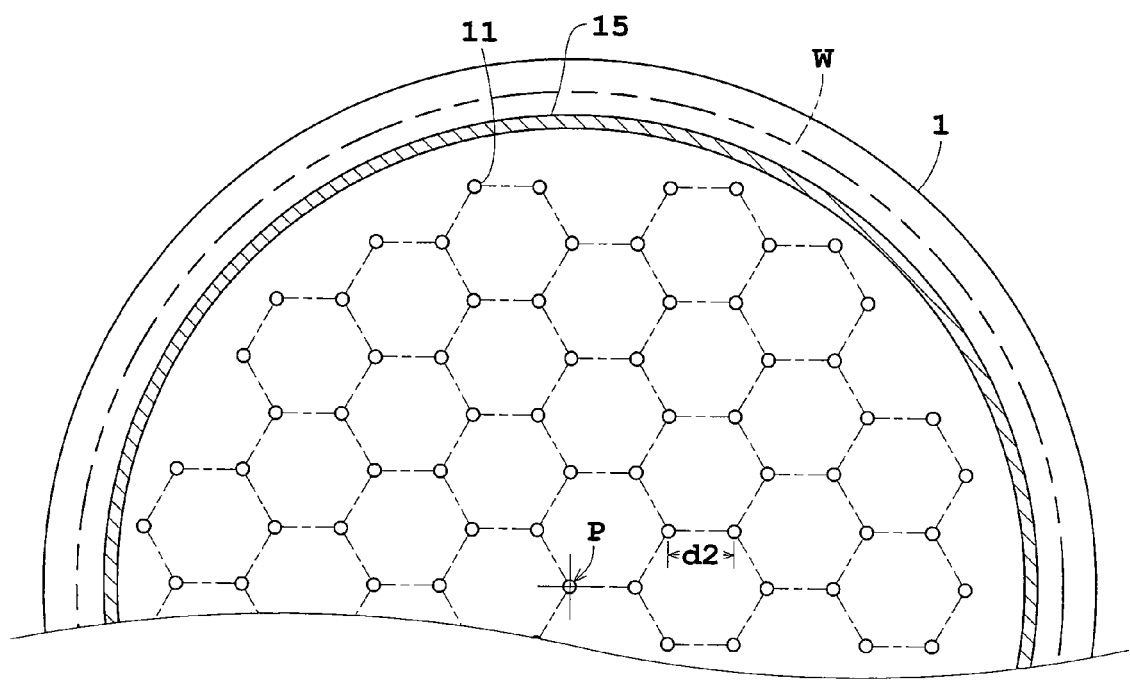
FIG. 7B is an explanatory view of a hexagon arrangement pattern.
Figure 8:
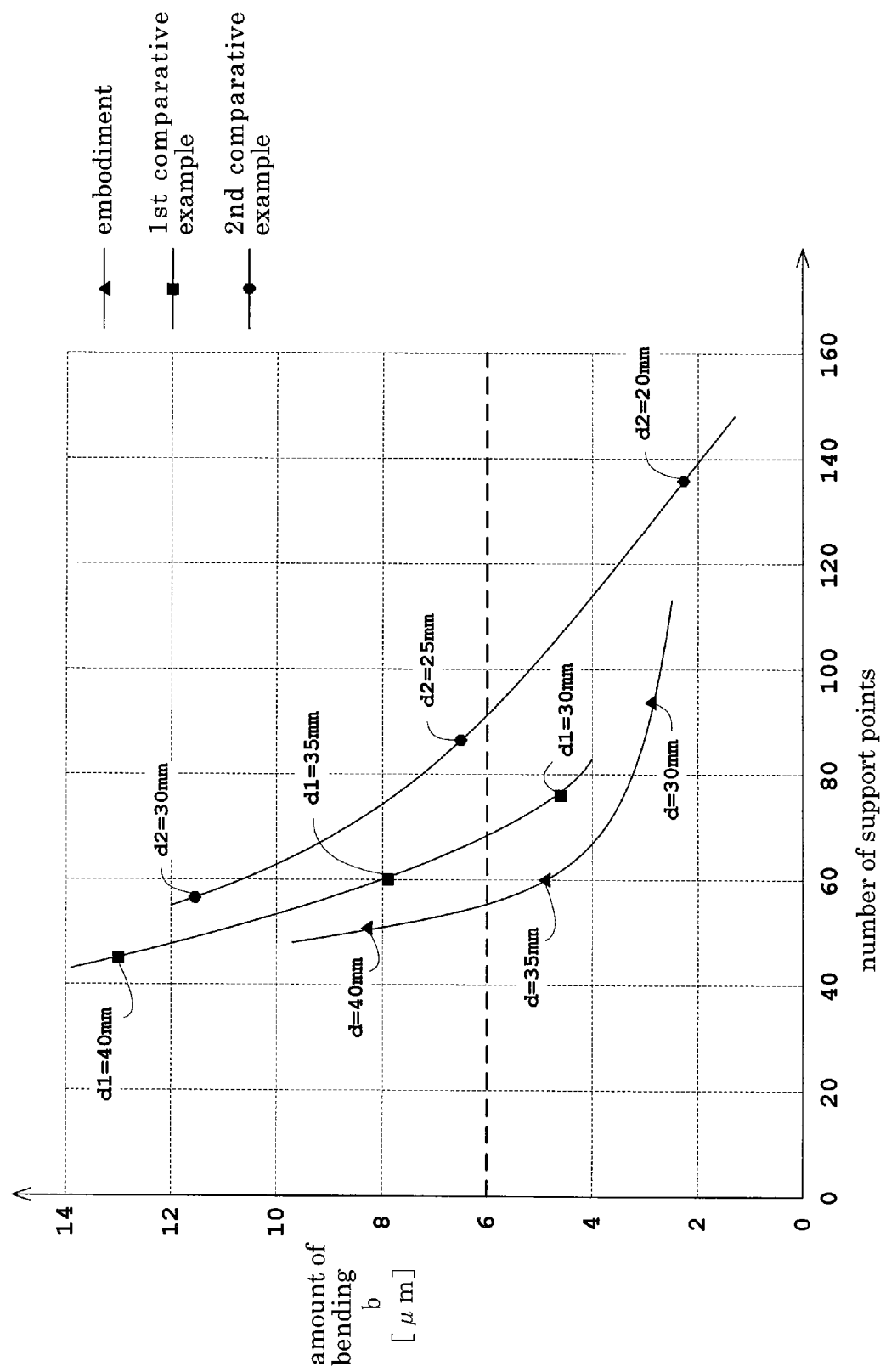
FIG. 8 is a schematic view for comparing the numbers of support points and amounts of bending of substrates in Embodiment 1 and first and second comparative examples.

Other methods of arrangement are illustrated for comparison with the above arrangement. FIG. 7A shows a first comparative example where the support elements 11 are located at the respective corners of squares arranged regularly. FIG. 7B shows a second comparative example where the support elements 11 are located at the respective corners of hexagons arranged regularly and continually. Each side of the squares or hexagons in the first or second comparative example has a length corresponding to a distance d1 or d2 between the support elements 11. FIG. 8 schematically shows characteristics of required numbers of support element 11 (hereinafter called simply the numbers of support points) and the amounts b of bending of the wafer W resulting from changes made in the respective distances d, d1 and d2 in this embodiment and the first and second comparative examples. In FIG. 8, the horizontal axis represents the numbers of support points (i.e. required numbers of support element 11), while the vertical axis represents the amounts b of bending of the wafer W. Values of d, d1 and d2 are plotted on the respective curves for this embodiment, and first and second comparative examples. In FIG. 8, the values are taken on the conditions that the wafer W is circular and 300 mm in diameter, and the pressure in the minute space "ms" is −4 kPa.

It will be seen that this embodiment can control the wafer W to the same amount b of bending with a smaller number of support points than the first and second comparative examples. When the number of support points is the same, this embodiment can reduce the amount b of bending of the wafer W more than the first and second comparative examples. In all of this embodiment, first comparative example and second comparative example, the amount b of bending at the center point of each polygon is considered larger than the amount b of bending at a halfway point of each side of the polygon. However, the illustrated results seem to indicate that this embodiment produces the least variation in the amount b of bending among different positions.

Further, as seen FIG. 8, where the distance d is set to 35 mm as in this embodiment, the amount b of bending of the wafer W is reduced to 6 μm or less.

<Step S3> Heat-treat Wafer W

A predetermined heat treatment is carried out for the wafer W while maintaining the wafer W in the suction-supported state for a predetermined time. Since the amount b of bending of the wafer W is 6 μm or less at this time, variations in temperature over the plane of the wafer W can be suppressed to 0.03 degree or less, based on a correlation between the amount b of bending and temperature difference of the wafer W.

<Step S4> Unload Wafer W

Upon completion of the heat treatment performed for the predetermined time, the controller 41 stops the vacuum suction source 23 and closes the pressure regulating valve 25, to stop the gas exhaustion from the minute space "ms" and return the pressure in the minute space "ms" to atmospheric pressure. As a result, the wafer W is released from suction. Subsequently, the air cylinder 37 is driven to raise the transfer members 31 and wafer W. In this state, the transport device, not shown, unloads the wafer W from the apparatus.

According to the substrate heat treatment apparatus in Embodiment 1, as described above, the support elements 11 are located, respectively, at the apexes of the equilateral triangles arranged regularly and continually. This arrangement can effectively inhibit the amount of bending of the wafer W.

With one of the support elements 11 located at the center point P of the heat-treating plate 1, the other support elements 11 can be arranged in positions symmetrical with respect to the center point P of the heat-treating plate 1.

A curvature of circular wafer W 300 mm in diameter can be corrected by adjusting the pressure in the minute space "ms" to −4 kPa.

By setting the distance d between the support elements 11 to 35 mm, the amount b of bending of the circular wafer W 300 mm in diameter, when the wafer W is sucked by a negative pressure of −4 kPa, can be reduced to 6 μm or less. As a result, variations in temperature over the plane of the wafer W can be suppressed to 0.03 degrees or less.

Embodiment 2

Embodiment 2 of this invention will be described hereinafter with reference to the drawings.

Figure 9:
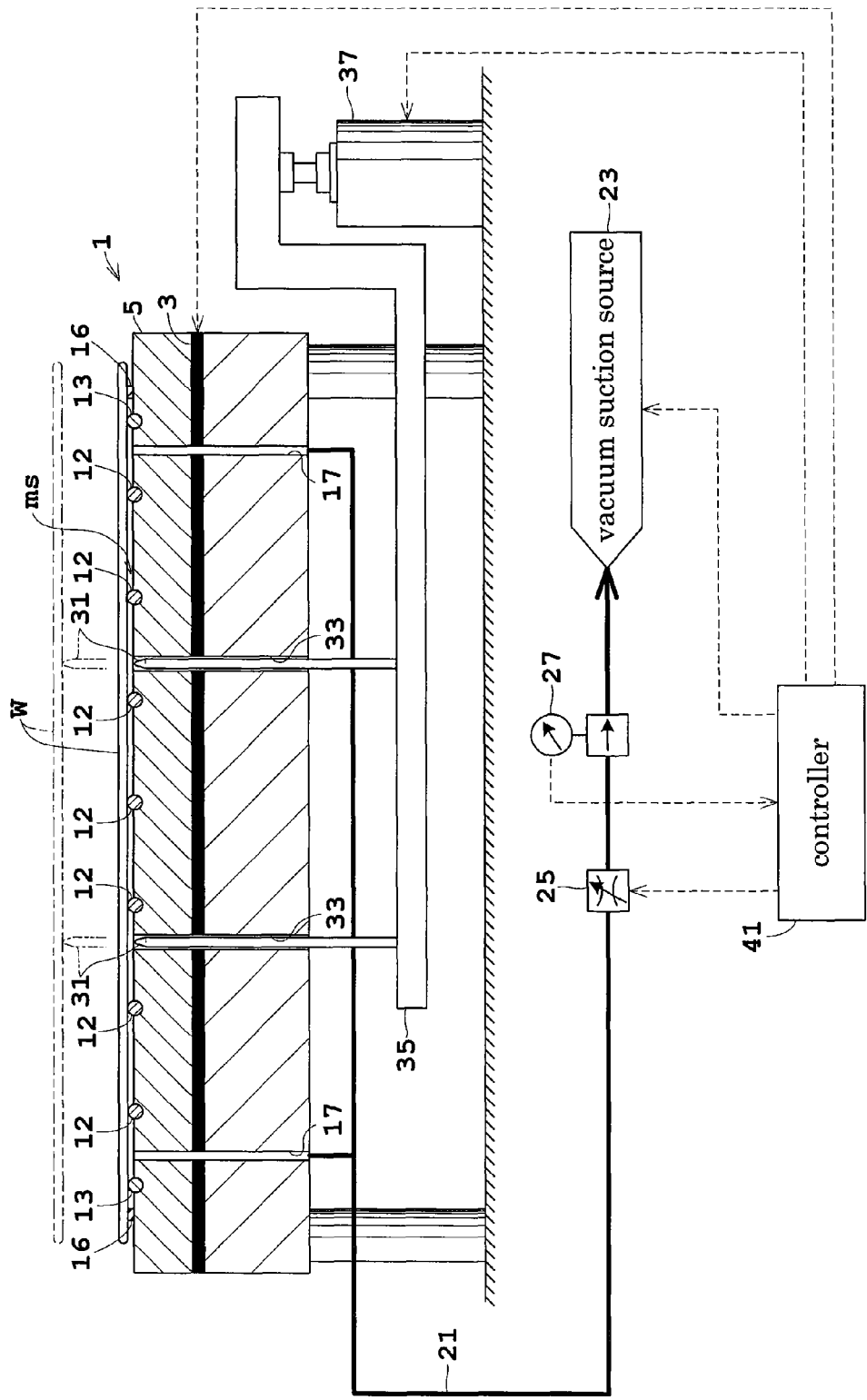
FIG. 9 is a view in vertical section showing an outline of a substrate heat treatment apparatus in Embodiment 2.
Figure 10:
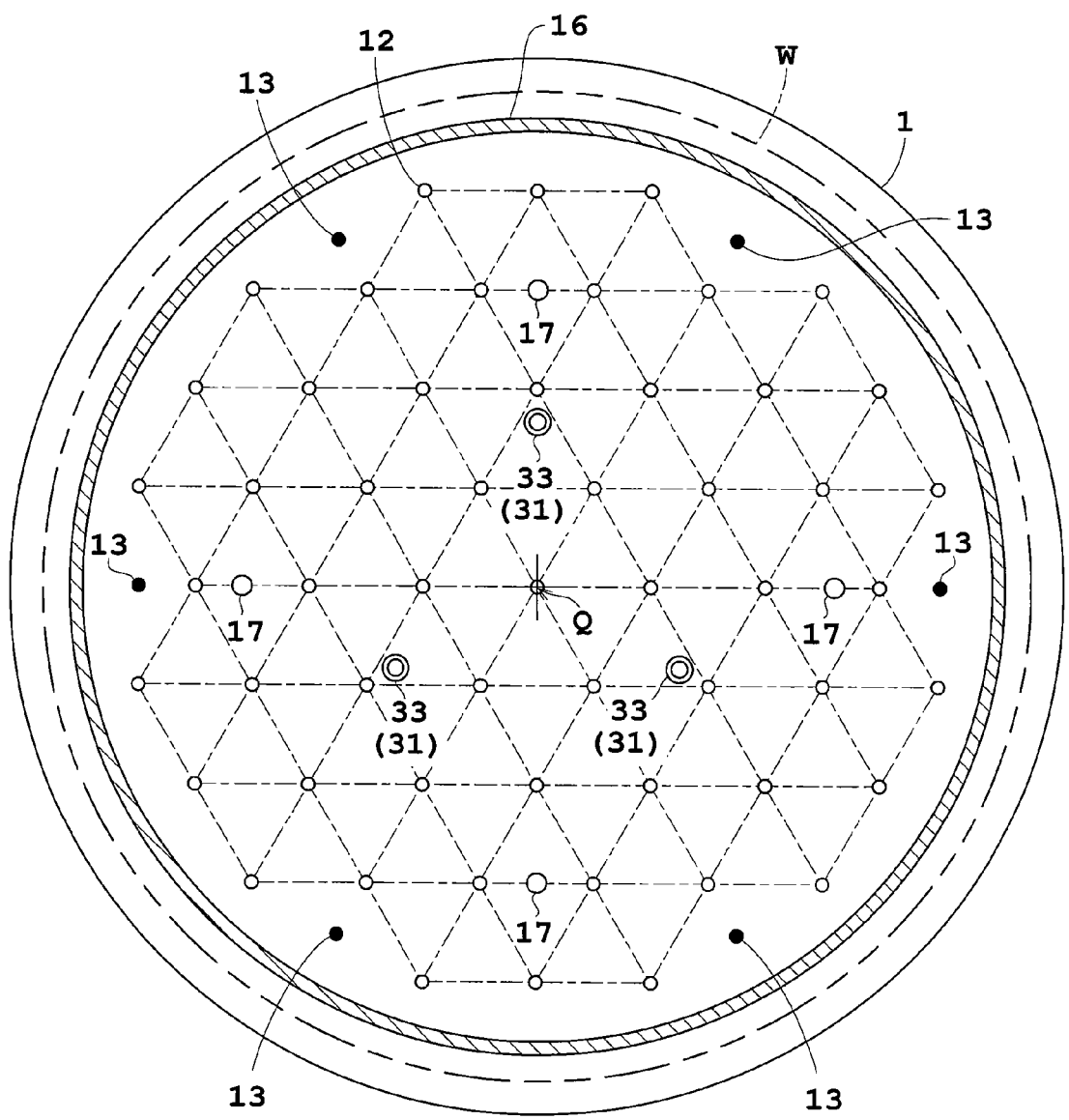
FIG. 10 is a plan view of a heat-treating plate.

FIG. 9 is a view in vertical section showing an outline of a substrate heat treatment apparatus in Embodiment 2. FIG. 10 is a plan view of a heat-treating plate. Like reference numerals are used to identify like parts which are the same as in Embodiment 1 and will not particularly be described.

A heat-treating plate 1 has a plurality of first support elements 12 and a plurality of second support elements 13 arranged on the upper surface thereof for contacting and supporting the lower surface of a wafer W. Further, the heat-treating plate 1 has a ring-shaped sealer 16 mounted on the upper surface thereof for contacting positions inward of the edges of the wafer W for rendering gastight a minute space "ms" formed between the wafer W and heat-treating plate 1.

The sealer 16 is ring-shaped and has an inside diameter slightly smaller than the outside diameter of the wafer W. In Embodiment 2, the sealer 16 is 280 mm in diameter, while the outside diameter of the wafer W is 300 mm. The sealer 16 is mounted on the upper surface of the heat-treating plate 1, with the center point Q of the hollow of the sealer 16 (hereinafter called simply "hollow center point") coinciding with the center of the heat-treating plate 1.

FIG. 10 refers. The first support elements 12 are regularly arranged on the upper surface of the heat-treating plate 1, and in the hollow of the sealer 16. In Embodiment 2, equilateral triangles are assumed to be arranged regularly and continually (in FIG. 10, the equilateral triangles are shown in alternate long and short dash lines), and the first support elements 12 are located at the apexes of these equilateral triangles, respectively. One of the first support elements 12 is located at the hollow center point Q of the sealer 16 in plan view. In other words, the first support elements 12 are located at intersections of a first group of imaginary lines including an imaginary line extending through the hollow center point Q and a plurality of equidistant imaginary lines extending parallel to the above-noted imaginary line, and a second group of imaginary lines rotated 60 degrees about the hollow center point Q from the first group of imaginary lines. The groups of straight lines extending in two given directions among the alternate long and short dash lines shown in FIG. 10 correspond also to the first and second groups of imaginary lines.

In Embodiment 2, the distance d between adjacent first support elements 12 is 35 mm. In this case, the number of first support elements 12 that can be arranged inwardly of the sealer 16 is 55.

Figure 11:
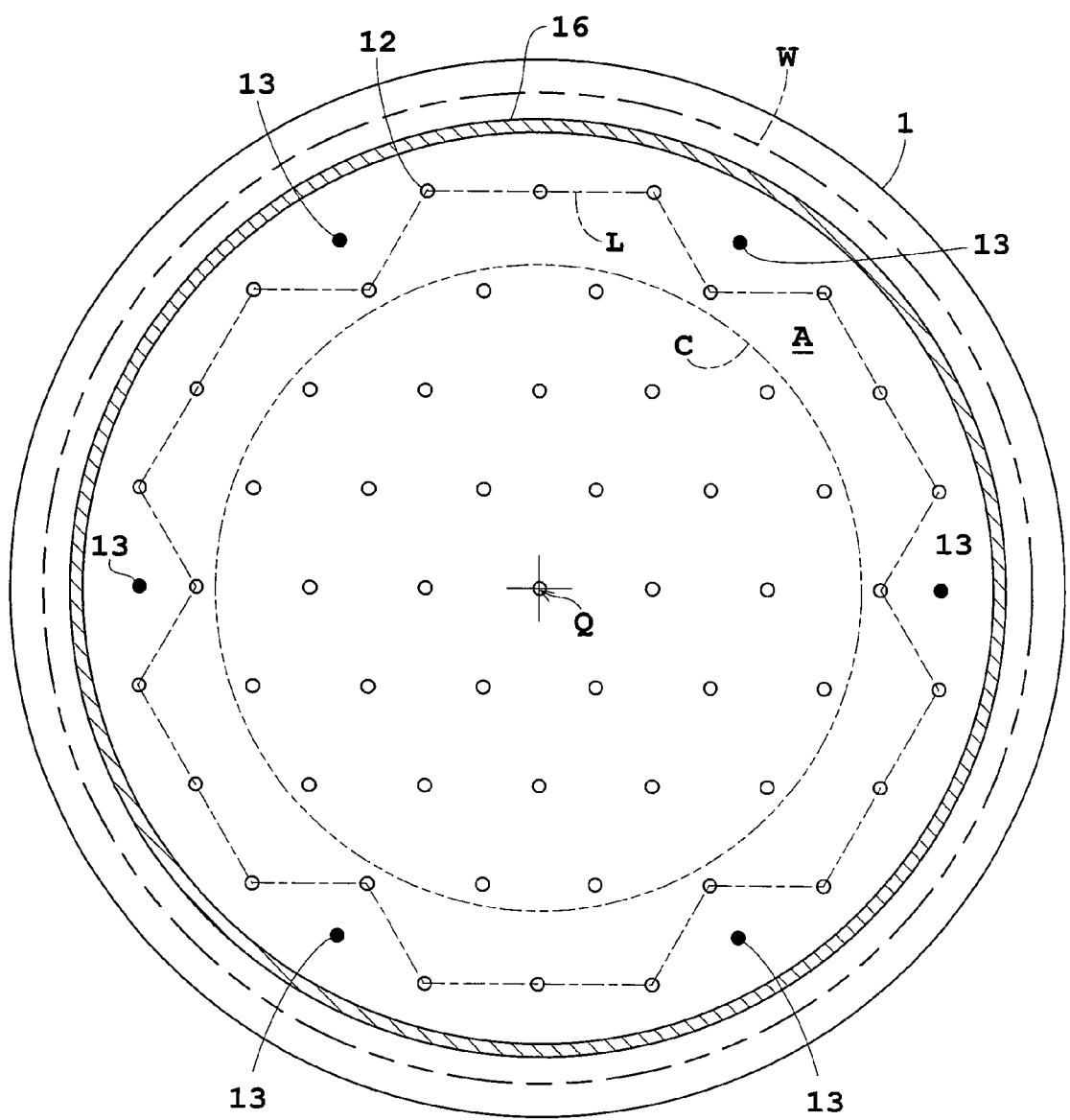
FIG. 11 is a plan view of the heat-treating plate schematically showing an imaginary polygonal line.

The second support elements 13 are arranged between the sealer 16 and parts, dented toward the center of the heat-treating plate 1, of an imaginary polygonal line linking the first support elements 12 arranged in outermost circumferential positions. FIG. 11 is a plan view of the heat-treating plate schematically showing the imaginary polygonal line L. In Embodiment 2, as shown, the imaginary polygonal line L is dented in six positions toward the center of the heat-treating plate 1. One second support element 13 is disposed in each of such positions.

This arrangement can supplement, with the second support elements 13, the spaces between the sealer 16 and those outermost first support elements 12 at the shortest distance to the hollow center point Q. FIG. 11 shows a ring-like region A of a predetermined width defined between the inner peripheral surface of the sealer 16 and an imaginary circle C concentric with and slightly smaller in diameter than the sealer 16. Ranges of the ring-like region A where the first support elements 12 are relatively sparse, that is where the first support elements 12 are arranged at relatively large intervals, can be supplemented with the second support elements 13. Naturally, the second support elements 13 are arranged in positions clear of the first support elements 12.

The first and second support elements 12 and 13 are spherical, and are formed of ceramics, for example. The heat-treating plate 1 has recesses formed in the upper surfaces thereof, in positions where the first and second support elements 12 and 13 are arranged. The first and second support elements 12 and 13 are fitted in and fixed to the recesses. The first support elements 12 and second support elements 13 correspond to the first support devices and the second support devices in this invention, respectively.

The sealer 16 has a height equal to the projecting height of the first and second support elements 12 and 13. The sealer 16, preferably, is formed of polyimide resin which has heat resistance and elasticity, for example. Another usable material is fluororesin. The sealer 16 corresponds to the seal device in this invention.

The number of exhaust bores 17 is four, which are formed in positions clear of the first and second support elements 12 and 13.

The transfer members 31 are arranged in positions corresponding to the apexes of an equilateral triangle centering on the hollow center point Q and clear of the first and second support elements 12 and 13 in plan view.

Operation of the substrate heat treatment apparatus having the above construction will be described with reference again to FIG. 4. Temperature control of the heating element 3, for example, is assumed to have already been carried out according to the recipe, and will be omitted from the following description. The features common to Embodiment 1 will be described only briefly.

<Step S1> Load Wafer W

As the transport device, not shown, loads a wafer W in horizontal posture into the apparatus, the controller 41 drives the air cylinder 37 to raise and lower the transfer members 31. As a result, the wafer W is placed on the first and second support elements 12 and 13, and the minute space "ms" is formed between the wafer W and heat-treating plate 1. The sealer 16, which is smaller in diameter than the wafer W, contacts positions inwardly of the edges of the wafer W to render the minute space "ms" gastight.

<Step S2> Suck Wafer W

The controller 41 drives the vacuum suction source 23, and operates the pressure regulating valve 25. As a result, the gas (i.e. air or nitrogen) in the minute space "ms" is exhausted through the exhaust bores 17 and exhaust piping 21, to adjust the pressure in the minute space "ms" to a negative pressure. The wafer W is sucked toward the heat-treating plate 1. Consequently, a curvature of wafer W, if any, is corrected to follow the first and second support elements 12 and 13 and the sealer 16.

Figure 12A:
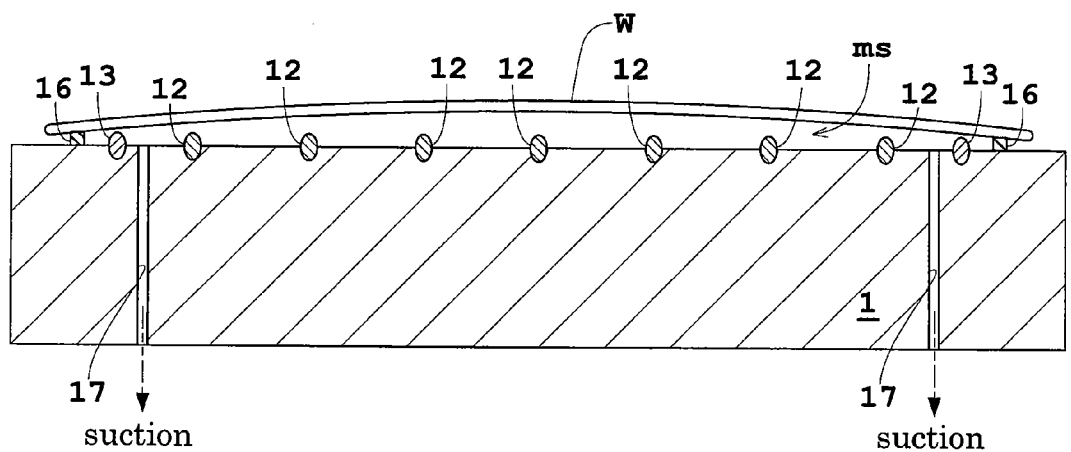
FIG. 12A is an explanatory view showing treatment of a curved substrate with a central portion thereof bulging away from the heat-treating plate.
Figure 12B:
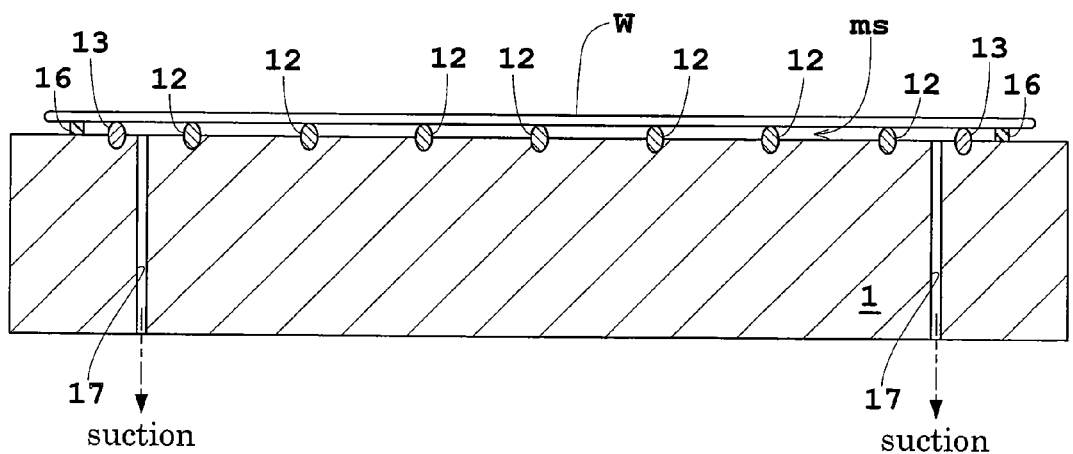
FIG. 12B is an explanatory view showing treatment of the curved substrate with the central portion bulging away from the heat-treating plate.
Figure 13A:
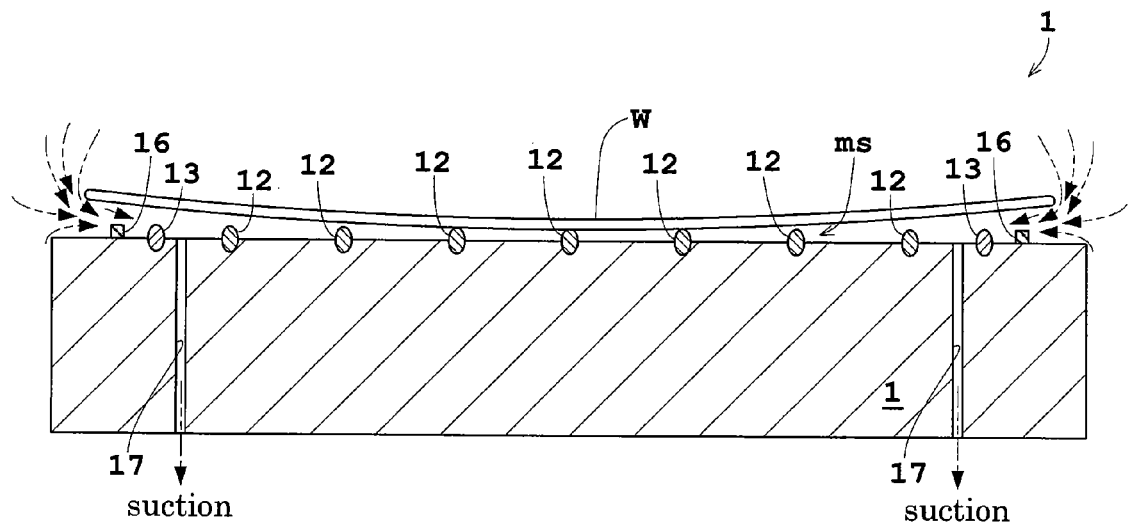
FIG. 13A is an explanatory view showing treatment of a curved substrate with a central portion thereof bulging toward the heat-treating plate.

This process will particularly be described with reference to FIGS. 12A, 12B, 13A and 13B. The curvature of wafer W includes a case where, as shown in FIG. 12A, the wafer W is curved to have the central part bulging upward (dome-like curvature), and a case where, as shown in FIG. 13A, the wafer W is curved to have the central part bulging downward (bowl-like curvature).

Figure 13B:
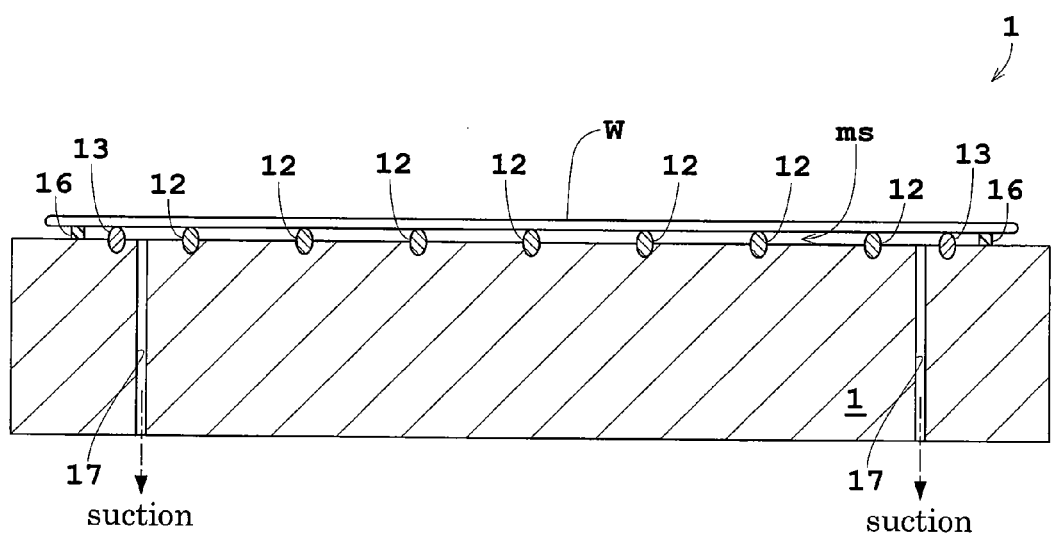
FIG. 13B is an explanatory view showing the treatment of the curved substrate with the central portion bulging toward the heat-treating plate.

When the wafer W has the central part bulging upward, the minute space "ms" is gastight. Thus, the wafer W is drawn by suction and the curvature of wafer W is corrected to be substantially level as shown in FIG. 12B. On the other hand, when the wafer W with the central part bulging downward is in place, the minute space "ms" remains open sideways. However, with Bernoulli effect produced (FIG. 13A shows air flows in two-dot chain lines), the curvature of wafer W is corrected to be substantially level as shown in FIG. 13B.

At this time, strictly speaking, between the first and second support elements 12 and 13 and the sealer 16, the wafer W sags slightly to be curved toward the heat-treating plate 1. However, since the second support elements 13 are arranged in appropriate positions, the sagging between the sealer 16 and outermost support elements 12 is no larger than the sagging between the first support elements 12. It is to be noted that the range between the sealer 16 and outermost support elements 12 refers to a range having no second support elements 13. Where the second support elements 12 are present, this range includes a range between the sealer 16 and second support elements 13 and a range between the second support elements 13 and outermost first support elements 12. It is therefore possible to restrain the edge regions of the wafer W from curving up about the sealer 16 serving as the fulcrum. As a result, no variation occurs with the distance between the wafer W and heat-treating plate 1 in the edge regions also.

Figure 14A:
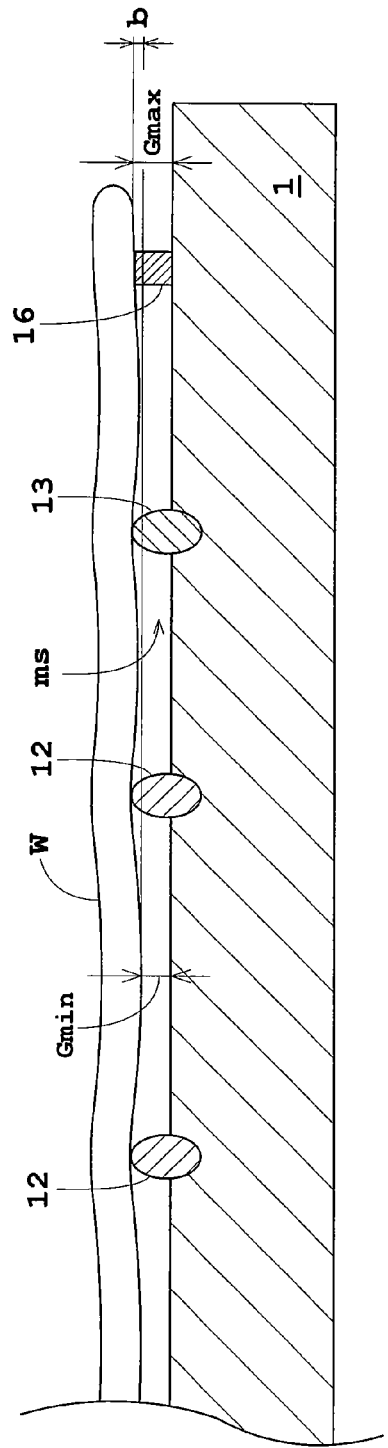
FIG. 14A is a fragmentary sectional view showing a state of an edge region of a sucked substrate in Embodiment 2.
Figure 14B:
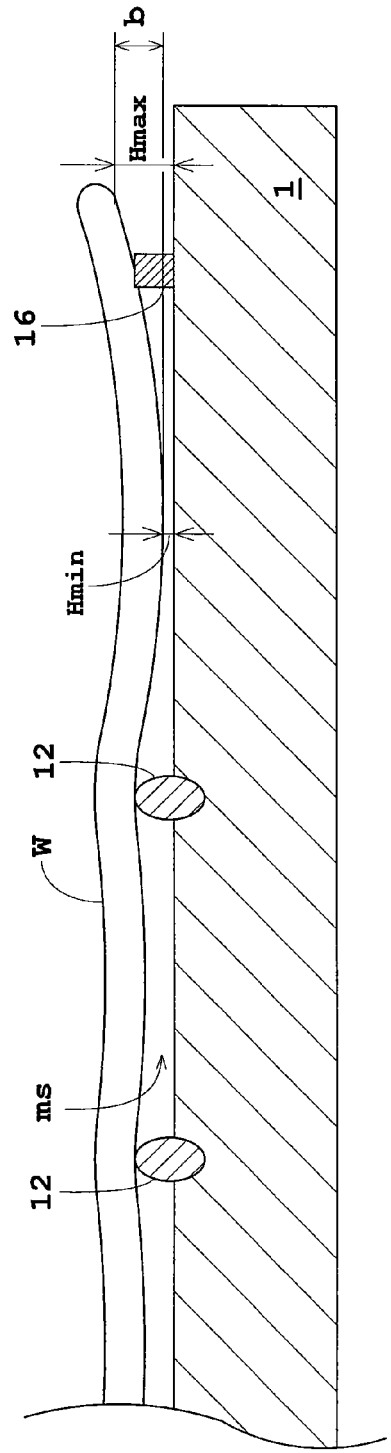
FIG. 14B is a fragmentary sectional view showing a state of an edge region of a sucked substrate in a comparative example having no second support elements.

The above arrangement will be described as compared with the case of having no second support elements 13 with reference to FIGS. 14A and 14B. FIG. 14A is a fragmentary sectional view showing a state of an edge region of a sucked wafer in Embodiment 2. FIG. 14B is a fragmentary sectional view showing a state of an edge region of a sucked wafer in a comparative example having no second support elements 13. It is assumed that the comparative example has the first support elements 12 arranged as in Embodiment 2.

As seen, in both Embodiment 2 and the comparative example, the wafer W sags toward the heat-treating plate 1 between the positions supported by the first and second support elements 12 and 13 and the sealer 15.

In Embodiment 2, however, since the second support elements 13 are provided, the greatest of the distances between the first and second support elements 12 and 13 and the sealer 16 is between the first support elements 12. Thus, it is between the first support elements 12 that the wafer W sags to the greatest extent toward the heat-treating plate 1. FIG. 14A schematically shows that the separation of the wafer W and heat-treating plate 1 (hereinafter called simply "separation") is minimum (G min) between the first support elements 12. Sagging of the wafer W is smaller between the sealer 16 and second support elements 13 and between the sealer 16 and first support elements 12 than between first support elements 12. Therefore, the wafer W is curved a relatively small amount away from the heat-treating plate 1 also. FIG. 14A schematically shows that the separation is maximum (Gmax) at the edge of the wafer W.

On the other hand, in the comparative example, the greatest of the distances between the first support elements 12 and the sealer 16 is between the outermost first support elements 12 and the sealer 16. This space is larger than the space between the support elements 12. Therefore, the separation of the wafer W and heat-treating plate 1 is minimum (H min) between the outermost first support elements 12 and the sealer 16 (see FIG. 14B). This minimum separation H min in the comparative example is smaller than the above minimum separation G min in Embodiment 2. Further, in the comparative example, the edge of the wafer W curves up about the sealer 16 serving as the fulcrum, to a large extent in a corresponding relationship with the large sagging between the outermost first support elements 12 and the sealer 16. Therefore, the separation is maximum (H max) at the edge of the wafer W. This maximum separation H max in the comparative example is larger than the maximum separation G max in Embodiment 2.

Thus, compared with the comparative example, variations in the separation of the heat-treating plate 1 and wafer W are inhibited in Embodiment 2. In other words, the amount b of bending which is a difference between maximum separation (G max, H max) and minimum separation (G min, H min) is smaller in Embodiment 2 than in the comparative example.

The first support elements 12 located, respectively, at the apexes of the equilateral triangles arranged regularly and continually can effectively inhibit the sagging of the sucked wafer W toward the heat-treating plate 1.

<Step S3> Heat-treat Wafer W

Since the amount b of bending of the wafer W is small at this time, variations in temperature over the plane of the wafer W can be suppressed.

<Step S4> Unload Wafer W

Upon completion of the heat treatment performed for a predetermined time, the controller 41 controls the vacuum suction source 23, pressure regulating valve 25, air cylinder 37 and so on, for unloading the wafer W.

According to the substrate heat treatment apparatus in Embodiment 2, as described above, the sealer 16 is in contact with positions inwardly of the edges of the wafer W. Thus, even when the end surface and edge regions on the back surface of wafer W are contaminated, the sealer 16 will never be contaminated by transfer. The wafer W may be heat-treated effectively without causing cross contamination.

With the second support elements 13 arranged as described, there occurs no variation in the separation of the wafer W and heat-treating plate 1 in the edge regions of the wafer W. Thus, the entire wafer W can be heat-treated uniformly.

The first support elements 12 are located at the respective apexes equilateral triangles arranged regularly and continually. This arrangement can efficiently inhibit bending of the wafer W.

With one of the first support elements 12 located at the hollow center point Q of the sealer 16, the distance between the outermost first support elements 12 and the sealer 16 will also vary regularly in the circumferential direction. This allows the second support elements 13 to be provided supplementally in positions distributed regularly. In this way, the arrangement of first and second support elements 12 and 13 is prevented from becoming complicated.

Embodiment 3

Figure 15:
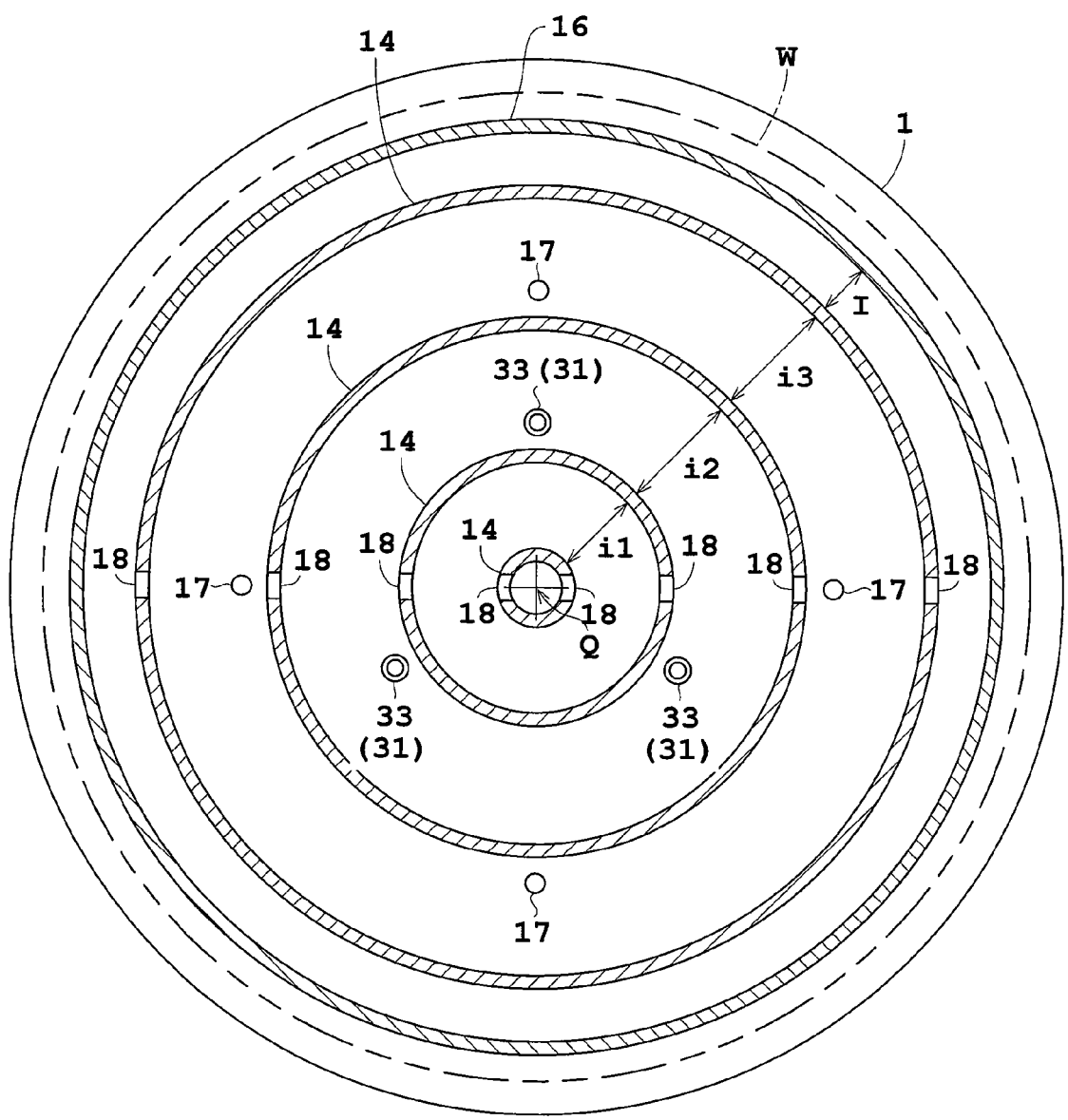
FIG. 15 is a plan view of a heat-treating plate.

Embodiment 3 of this invention will be described hereinafter with reference to FIG. 15. Like reference numerals are used to identify like parts which are the same as in Embodiment 1 or 2 and will not particularly be described. FIG. 15 is a plan view of a heat-treating plate.

Embodiment 3 is directed to a substrate heat treatment apparatus having support elements 14, as described below, in place of the first and second support elements 12 and 13 in Embodiment 2. The heat-treating plate 1 has a plurality of (e.g. four) support elements 14 formed on the upper surface thereof for contacting and supporting the lower surface of a wafer W. The support elements 14 are ring-shaped, different in diameter, and arranged concentrically. Grooves 18 are formed in varied positions of each support element 14. Thus, even when the support elements 14 are in contact with the wafer W, the regions inside and outside each support element communicate with each other. The grooves 18 correspond to the vents in this invention.

A sealer 16 is formed outside the outermost support element 14. The diameters of the sealer 16 and each support element 14 are set such that interval I between the outermost support element 14 and sealer 16 is smaller than intervals i1, i2 and i3 between the support elements 14. For example, the radius of sealer 16 may be 140 mm and those of the support elements 14 may be 10 mm, 40 mm, 80 mm and 120 mm, respectively. In this case, interval I is 20 mm, and intervals i1, i2 and i3 are 30 mm, 40 mm and 40 mm, respectively. Thus, interval I is smaller than the other intervals i1, i2 and i3.

The support elements 14 have the same height as the sealer 16. The support elements 14, preferably, are formed of polyimide resin which has heat resistance and elasticity, for example. Another usable material is fluororesin. The support elements 14 correspond to the support devices in this invention.

Operation of the substrate heat treatment apparatus in Embodiment 3 in time of sucking the wafer W will be described next.

Between the wafer W and heat-treating plate 1, a single minute space "ms" is formed by communication through the grooves 18, without being divided by each support element 14. The controller 41 operates the vacuum suction source 23 and pressure regulating valve 25 to adjust the pressure in the minute space "ms" to a negative pressure. The wafer W is drawn toward the heat-treating plate 1, and is leveled to follow the support elements 14 and sealer 16. At this time, strictly speaking, the wafer W sags between the support elements 14 and between the outermost support element 14 and sealer 16. However, since interval I between the outermost support element 14 and sealer 16 is relatively small, sagging of the wafer W in this interval is smaller than that between the support elements 14. As a result, no variation occurs in the separation of the wafer W and heat-treating plate 1 at the edges of the wafer W.

According to the substrate heat treatment apparatus in Embodiment 3 also, the sealer 16 is in contact with positions inwardly of the edges of the wafer W. Thus, even when the end surface and edge regions on the back surface of wafer W are contaminated, the sealer 16 will never be contaminated by transfer. The wafer W may be heat-treated effectively without causing cross contamination.

With the relatively small interval I between the sealer 16 and outermost support element 14, there occurs no variation in the separation of the wafer W and heat-treating plate 1 in the edge regions of the wafer W. Thus, the entire wafer W can be heat-treated uniformly.

The grooves 18 allow the minute space "ms" to be undivided. Thus, exhaust bores 17 may be formed in any desired positions.

This invention is not limited to the foregoing embodiments, but may be modified as follows:

(1) In Embodiment 1 described hereinbefore, the distance d between the support elements 11 is 35 mm, and the pressure in the minute space "ms" is adjusted to −4 kPa. These values are not limitative. Similar effects are produced when the pressure in the minute space "ms" is appropriately varied to a negative pressure of −4 kPa or above and less than 0 Pa. Similar effects are produced when, correspondingly to the above, the distance d between the support elements 11 is appropriately varied in a range of 40 to 35 mm.

(2) In Embodiment 1 described hereinbefore, the wafer W is circular and 300 mm in diameter. This is not limitative. For example, the invention is applicable also to substrate heat treatment apparatus for treating circular wafers having diameters other than 300 mm, or treating rectangular substrates.

(3) In Embodiment 1 described hereinbefore, the support elements 11 are spherical, and are formed of ceramics. For example, any other suitable shape may be employed as long as the support elements project from the upper surface of heat-treating plate 1. The material of the support elements 11 may be changed to a resin or the like.

(4) In Embodiments 2 and 3 described hereinbefore, the sealer 16 is 280 mm in diameter for contacting positions 10 mm inward from the edges of the circular wafer W 300 mm in diameter. This value can be changed as appropriate.

(5) In Embodiment 2 described hereinbefore, the first support elements 12 are located at the apexes of equilateral triangles arranged regularly and continually. The invention is not limited to this arrangement. For example, the equilateral triangles may be replaced with squares or hexagons, or other shapes that can be arranged regularly.

(6) In Embodiment 2 described hereinbefore, the second support elements 13 are arranged between the sealer 16 and the positions of the imaginary polygonal line dented toward the center of the heat-treating plate 1. This is not limitative. For example, whether the imaginary polygonal line is dented or not, the second support elements 13 may be arranged between the sealer 16 and the outermost first support elements 12 at the shortest distance to the hollow center point Q. Instead of being limited to the shortest distance to the hollow center point Q, the second support elements 13 may be arranged in appropriate positions in regions where the outermost first support elements 12 are sparse.

(7) In Embodiments 2 and 3 described hereinbefore, the wafer W is circular and 300 mm in diameter. This is not limitative. For example, the invention is applicable also to substrate heat treatment apparatus for treating circular wafers having diameters other than 300 mm, or treating rectangular substrates. When treating rectangular substrates, the sealer 16 may suitably be formed rectangular.

(8) In Embodiment 3 described hereinbefore, grooves 18 are formed in each support element 14. The grooves 18 may be replaced with other appropriate means for allowing communication between the regions inside and outside each support element. Instead of forming grooves 18 in each support element 14, grooves or through-holes may be formed in the heat-treating plate 1, for example.

(9) In Embodiment 2 described hereinbefore, the first and second support elements 12 and 13 are spherical, and are formed of ceramics. For example, any other suitable shape may be employed as long as the support elements project from the upper surface of heat-treating plate 1. The material of the first and second support elements 12 and 13 may be changed to a resin or the like.

(10) In each of Embodiments 1, 2, and 3 described hereinbefore, heat pipes are embedded in the heat transfer portion 5. The invention is applicable also to a substrate heat treatment apparatus having no heat pipes.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate heat treatment apparatus for heat-treating a substrate, comprising:
    a heat-treating plate;
    support devices projecting from an upper surface of said heat-treating plate for contacting and supporting a lower surface of the substrate, said support devices being located at apexes of equilateral triangles arranged regularly and continually on said upper surface;
    a seal device disposed annularly on the upper surface of said heat-treating plate for contacting an edge region of the substrate to render gastight a space formed between the substrate and said heat-treating plate; and
    exhaust bores for exhausting gas from said space; wherein said substrate is circular and 300 mm in diameter;
    said space has an inner pressure reduced to —4kPa or above and less than 0Pa by exhaust through said exhaust bores; and
    said support devices are arranged at intervals of 35 to 40 mm inclusive.

2. An apparatus as defined in claim 1, wherein one of said support devices is located at a center point of said heat-treating plate.

3. An apparatus as defined in claim 1, wherein said support devices are formed of one of ceramic and resin.

4. An apparatus as defined in claim 1, wherein said heat-treating plate has recesses formed in the upper surface thereof for fixing said support devices.

5. A substrate heat treatment apparatus for heat-treating a substrate, comprising:
    a heat-treating plate;
    support devices projecting from an upper surface of said heat-treating plate for contacting and supporting a lower surface of the substrate, said support devices being located at intersections of a first group of equidistant, parallel imaginary lines extending across the upper surface of said heat-treating plate, and a second group of equidistant, parallel imaginary lines crossing said first group of imaginary lines at 60-degree angles on the upper surface of said heat-treating plate, said first group of imaginary lines having equal spacing to said second group of imaginary lines;
    a seal device disposed annularly on the upper surface of said heat-treating plate for contacting an edge region of the substrate to render gastight a space formed between the substrate and said heat-treating plate; and
    exhaust bores for exhausting gas from said space; wherein said substrate is circular and 300 mm in diameter;
    said space has an inner pressure reduced to —4kPa or above and less than 0Pa by exhaust through said exhaust bores; and
    said support devices are arranged at intervals of 35 to 40 mm inclusive.

6. An apparatus as defined in claim 5, wherein one of said support devices is located at a center point of said heat-treating plate.

7. An apparatus as defined in claim 5, wherein said support devices are formed of one of ceramic and resin.

8. An apparatus as defined in claim 5, wherein said heat-treating plate has recesses formed in the upper surface thereof for fixing said support devices.

9. A substrate heat treatment apparatus for heat-treating a substrate, comprising:
    a heat-treating plate;
    a plurality of annular support devices arranged concentrically on an upper surface of said heat-treating plate for contacting and supporting a lower surface of the substrate;
    vents provided in said support devices for communicating between regions inside and outside said support devices;
    a seal device disposed annularly on the upper surface of said heat-treating plate for contacting positions inward of edges of the substrate to render gastight a space formed between the substrate and said heat-treating plate; and
    exhaust bores for exhausting gas from said space; wherein an interval between said seal device and an outermost one of said support devices is smaller than intervals between said support devices.

10. An apparatus as defined in claim 9, wherein said vents are grooves formed in each of said support devices.

11. An apparatus as defined in claim 9, wherein said support devices are formed of one of polyimide resin and fluororesin.

* * * * *